United States Patent

[11] 3,582,726

[72] Inventors George J. Gilbert
Whitehouse Station;
Ronald Rosenzweig, Madison, both of N.J.

[21] Appl. No. 854,964
[22] Filed Sept. 3, 1969
[45] Patented June 1, 1971
[73] Assignee Microwave Semiconductor Corp.
Somerset, N.J.

[54] HIGH-FREQUENCY POWER TRANSISTOR HAVING A PLURALITY OF DISCRETE BASE AREAS
13 Claims, 8 Drawing Figs.

[52] U.S. Cl. .......... 317/235, 317/234
[51] Int. Cl. .......... H01l 11/00, H01l 15/00
[50] Field of Search .......... 317/234, 235, 40, 40.1, 40.12, 40.13, 41

[56] References Cited

UNITED STATES PATENTS

| | | | |
|---|---|---|---|
| 3,427,511 | 2/1969 | Rosenzweig .......... | 317/235 |
| 3,434,019 | 3/1969 | Carley .......... | 317/235 |
| 3,444,443 | 5/1969 | Moroshima .......... | 317/235 |
| 3,457,631 | 7/1969 | Hall et al. .......... | 317/235 |

*Primary Examiner*—John W. Huckert
*Assistant Examiner*—Andrew J. James
*Attorney*—Pennie, Edmonds, Morton, Taylor and Adams

ABSTRACT: Emitter rows each having a plurality of discrete base areas spaced therealong alternate with rows of base material. Emitter contact areas extend through an insulating layer between discrete base areas. Base contact areas extend through the insulating layer to the discrete base areas and to spaced areas in the base rows, preferably in aligned columns. Advantageously the outer rows are base rows and opposite ends of the emitter rows are open ended.

INVENTORS
GEORGE J. GILBERT
RONALD ROSENZWEIG

BY Pennie Edmonds Morton Taylor & Adams
ATTORNEYS

INVENTORS
GEORGE J. GILBERT
RONALD ROSENZWEIG

BY
Pennie Edmonds Morton Taylor & Adams

ATTORNEYS

INVENTORS
GEORGE J. GILBERT
RONALD ROSENZWEIG

BY Pennie Edmonds Morton Taylor & Adams

ATTORNEYS

HIGH-FREQUENCY POWER TRANSISTOR HAVING A PLURALITY OF DISCRETE BASE AREAS

BACKGROUND OF THE INVENTION

The present invention is directed to a high frequency power transistor capable of producing substantial amounts of power at frequencies extending into the microwave region.

In such transistors it is important to have large peripheries between emitter and base areas in order to obtain large currents, since emitter injection is largely around the periphery at high current levels rather than being uniform over the emitter area. It is also important to have a fairly uniform voltage drop across the emitter-base junction to insure uniform injection, since nonuniform injection may cause hotspots and premature falloff of $f_t$ (the frequency at which current gain becomes unity). Further, for high frequency operation it is important to keep the emitter-base and collector-base capacitances as small as possible.

Transistors are known in which a multiplicity of discrete emitter areas arranged in rows and columns are diffused into the base layer, and made as small as possible so as to provide a high ratio of emitter periphery to emitter area. With an NPN type transistor, a grid of P+ material is formed in the base layer around the base areas which in turn surround the discrete emitter areas, so as to provide greater conductivity between the base contact areas and the base material. An insulating layer overlays the emitter and base patterns, and openings are made therein for depositing metal to form contact areas to the emitter areas and to the P+ portions of the base area.

Practical restrictions in masking techniques as to fineness of lines and accuracy of registration impose a limit on the smallness of the emitter areas while still allowing holes to be reopened for emitter contact areas. To avoid the necessity of reforming the insulating layer after diffusing the emitter areas, and reopening holes therein, lateral diffusion of the emitter areas under the edges of the insulating layer has been resorted to in order to form an emitter-base junction which is protected by the insulating layer and allow direct deposition of contact areas. However, as the emitter areas become very shallow to obtain high $f_t$'s, the lateral diffusion under the insulating layer becomes insufficient to protect the junction from being shorted by the emitter metallizing. Consequently, poor processing yield and a low reliability level result. Also, the need to provide adequate widths for diffusion of the P+ grid limits the number of discrete emitter areas which can be formed in a given overall area.

Transistors are also known in which a multiplicity of discrete base areas arranged in rows and columns are surrounded by a grid or lattice of emitter material. Metallized areas within the discrete base areas are connected together by parallel fingers of a surface conductive coating, and parallel metallized strips of the emitter grid are connected by parallel interdigitated fingers of a surface conductive coating. The resulting large emitter area poses problems in processing yield since the greater the area, the greater the possibility of punch-through from emitter to collector in diffusing the emitter when the base region under the emitter is made very thin in order to extend the high frequency range.

The transistor of the present invention provides a large emitter-base periphery for high current handling capacity; allows the use of reopened emitter contacts to improve emitter-to-base processing yields and to provide protection against high temperature degradation, thereby improving reliability; and employs a reduced emitter area for greater processing yield. The reduced emitter area also improves the small signal $f_t$ and linearity, and is believed to increase high current efficiency. The design permits short paths from emitter and base contact areas to the emitter-base junction, thereby maintaining a fairly uniform voltage drop across the junction. Additional advantages will be apparent hereinafter.

SUMMARY OF THE INVENTION

The high frequency power transistor of the invention comprises a collector layer, a base layer overlaying the collector layer, and a plurality of spaced emitter rows alternating with base rows. Each emitter row has a plurality of discrete base areas spaced therealong. Emitter-base junctions are hence formed around the peripheries of the discrete base areas, and between each emitter row and the base row on either side thereof.

An insulating layer overlays the emitter and base rows, and has emitter contact areas extending therethrough to the emitter rows between adjacent discrete base areas. The insulating layer also has base contact areas extending therethrough to the discrete base areas within the peripheries thereof, and to contact areas of the base rows in approximate alignment with those of the discrete base areas. Conductive coatings on the insulating layer connect the emitter contact areas and the base contact areas, respectively, and may be in the form of interdigitated fingers.

Preferably the discrete base areas of the emitter rows are uniformly spaced therealong and in vertical alignment to form columns, and are approximately rectangular. Also preferably, the contact areas to the discrete base areas are rectangular and the contact areas to the base rows are similar and in vertical alignment therewith. Advantageously the spacing of the base contact areas of the base rows from the adjacent base-emitter junctions is approximately equal to the spacing of the base contact areas of the discrete base areas from the adjacent base-emitter junctions. Also, advantageously the same spacing is employed between the sides of each discrete base area and the sides of the contact area therewithin.

It is also preferred to employ base rows as the outer rows of the transistor, and to have opposite ends of each emitter row open, to promote efficiency.

DESCRIPTION OF THE SPECIFIC EMBODIMENTS

Figure 1:
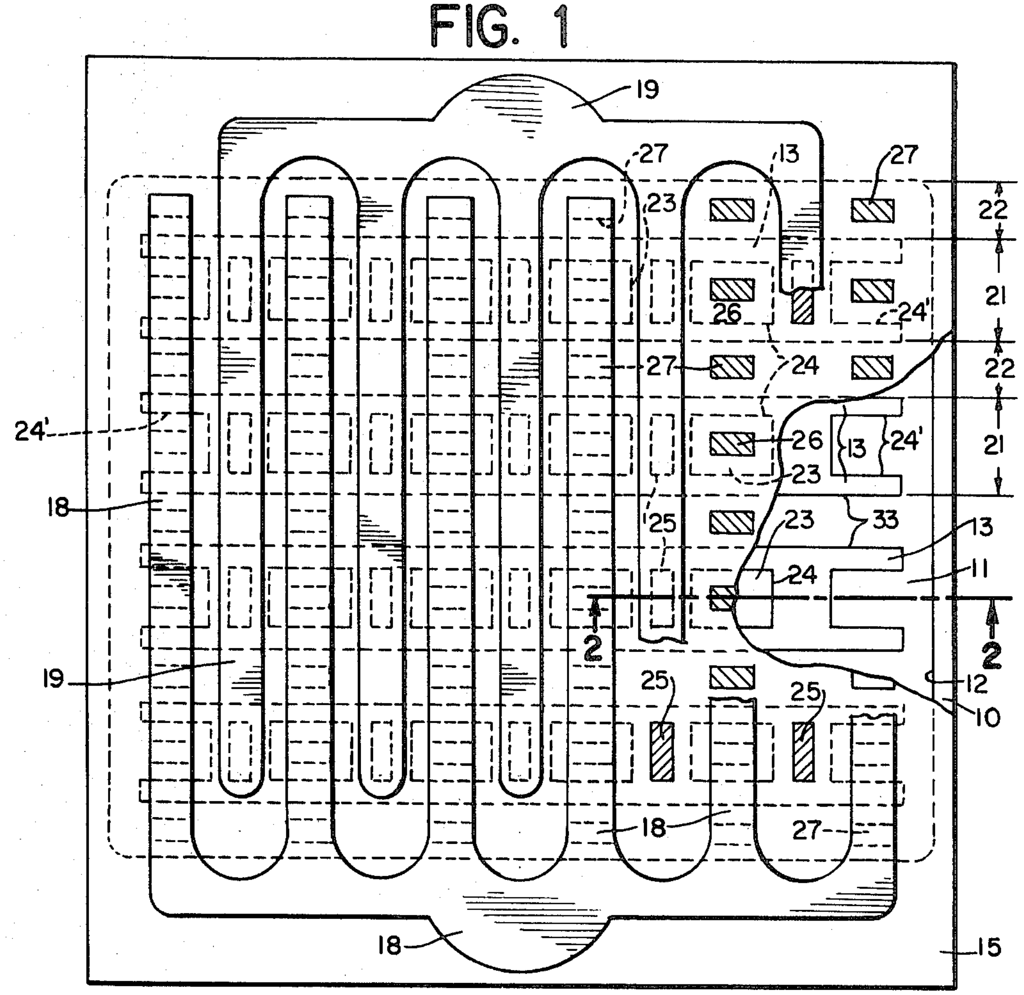
FIG. 1 is a plan view, with portions successively broken away, of a high frequency power transistor in accordance with the invention.
Figure 2:
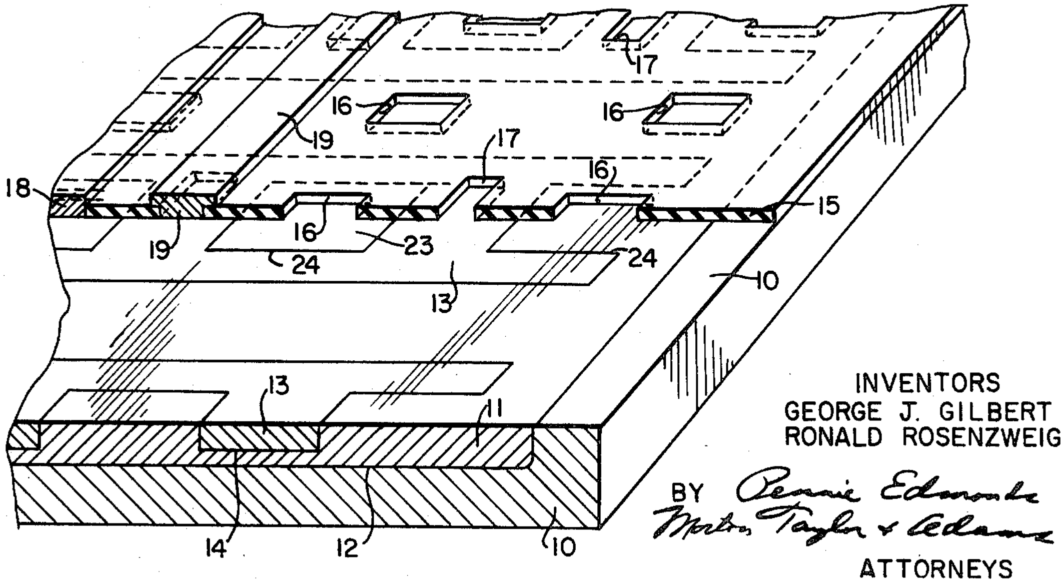
FIG. 2 is a perspective view of a portion of the transistor of FIG. 1, with portions successively broken away.

Referring to FIGS. 1 and 2, the transistor has a bottom collector layer 10 of one type of semiconductor material, say N-type. A base layer 11 of opposite type of semiconductor material, say P-type, overlays the collector layer and may be formed by diffusion techniques well known in the art. A base-collector junction 12 is thereby defined. Emitter areas 13 of the first type of semiconductor material, say N-type, extend into the base layer and may be formed by diffusion techniques, thereby forming base-emitter junctions 14. A layer 15 of insulating material such as silicon oxide overlays the base and emitter areas, and has openings 16 and 17 therein through which suitable conductive metallization extends to form contact areas with base and emitter areas, respectively. Conductive coatings 18 and 19 connect through openings 16 and 17 with respective base and emitter contact areas in the coating.

It will be understood that the thicknesses of the various layers shown are exaggerated for clarity of illustration and the outlines are somewhat idealized. In practice the diffused layers and metallized layers are ordinarily very thin compared to their lateral dimensions, and the outlines are likely to be somewhat irregular with rounded corners. This is impractical to illustrate. Also, it will be understood that the number of rows and the number of discrete base areas along an emitter row may be selected as desired for a particular application.

The configuration provides a plurality of spaced parallel emitter rows 21 and intervening base rows 22. Each emitter row 21 has a plurality of discrete base areas 23 spaced therealong forming base-emitter junctions whose peripheries are designated 24. Advantageously the discrete base areas 23 are rectangular as shown, and uniformly spaced along the respective emitter row. If desired they could be oval, or with the long sides straight and the ends curved, etc. Conductive emitter contact areas 25 extend through the insulating layer 15 to the emitter rows between adjacent discrete base areas 23. Conductive base contact areas 26 extend through the insulating layer 15 to the discrete base areas 23 within respective base-emitter junction peripheries 24. Conductive base contact areas 27 also extend through the insulating layer 15 to areas of the base rows 22, advantageously in vertical alignment with base contact areas 26.

The base contact areas 26 and 27 are connected together by a suitable conductive means here shown as a conductive coating 18 on insulating layer 15, having fingers which extend over the base contact areas and make contact therewith. Similarly, the emitter contact areas 25 are connected together by suitable conductive means, here shown as a conductive coating 19 on the insulating layer 15 having fingers which extend over the emitter contact areas and make contact therewith.

As will be observed, the upper and lower rows are base rows, with contact areas 27 extending thereto from fingers of the base conductive coating 18. Also, opposite ends of each emitter row 21 are open in respect of emitter material to form base-emitter junctions 24' which are open toward the base material adjacent the opposite ends. This assists in promoting efficiency, as will be explained.

Figure 3:
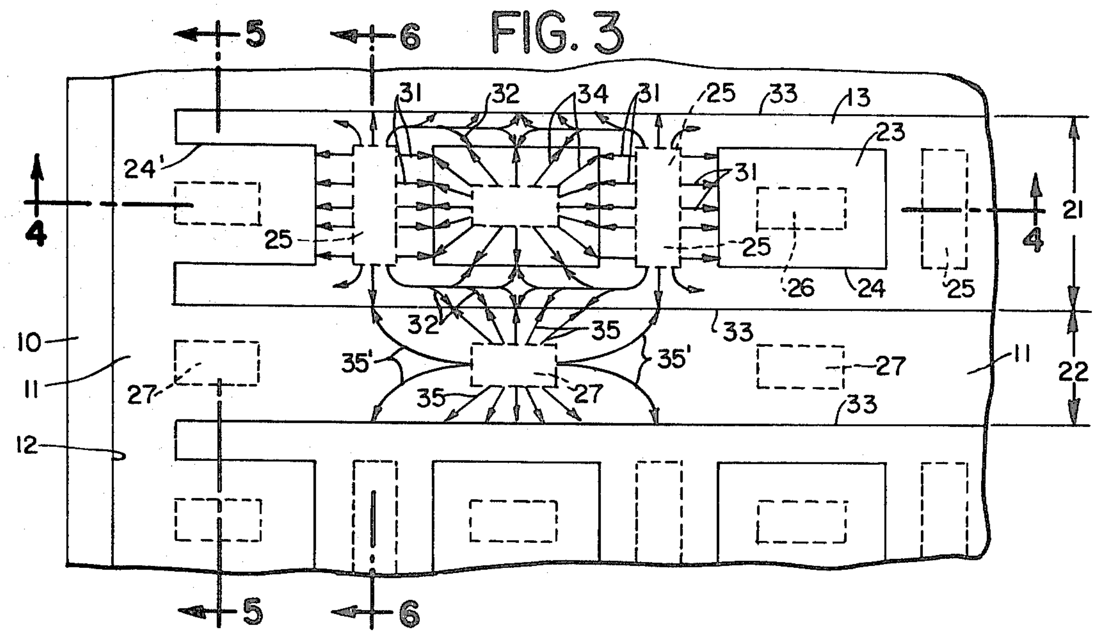
FIG. 3 is a plan view of a portion of the transistor of FIG. 1 with insulating and conductive contact areas removed.
Figure 4:
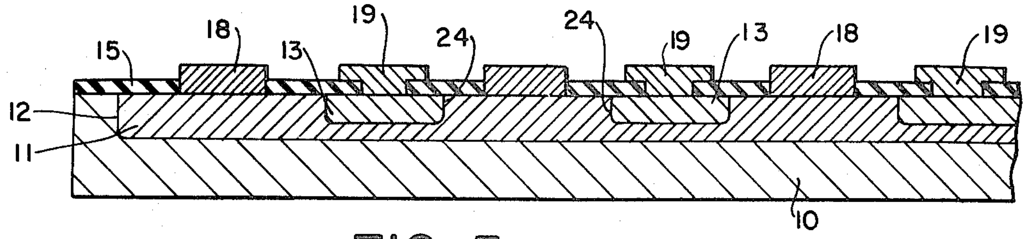
FIGS. 4, 5 and 6 are cross sections taken along lines 4–4, 5–5 and 6–6 of FIG. 3, respectively, but with insulating and conductive contact areas in place.
Figure 5:
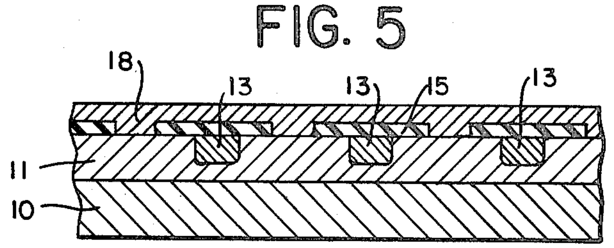
Figure 6:
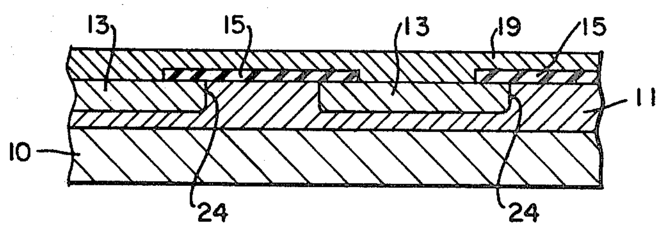

Referring to FIG. 3, a portion of the transistor of FIG. 1 is shown with the insulating layer 15 and conductive areas 18, 19 removed. Base and emitter areas are indicated as in FIG. 1. The emitter and base contact areas 25, 26 would not be visible in this view, but are shown in dotted lines to indicate the areas of actual contact. An NPN transistor is assumed. Arrows 31 illustrate the flow of emitter current (electron flow) to the adjacent sides of the discrete base areas 23 and the base-emitter junctions thereat. Arrows 32 illustrate the flow of emitter current along the upper and lower sides of the discrete base areas to the base-emitter junctions thereat, and also to the junctions 33 between the emitter row 21 and the base rows 22 on either side thereof. Arrows 34 illustrate the flow of base current (hole flow) to the discrete base area junctions. Arrows 35 illustrate the flow of base current from the base contact areas 27 in the base row 22 to the base-emitter junctions 33. The flow patterns are illustrative only, and are not intended to be accurate in detail. Nevertheless they suffice for purposes of explanation.

With a spacing from a discrete base contact area 26 to the lower (or upper) side of the junction 24 equal to the spacing of a base row contact area 27 to the junction 33, injection at the lower side of 24 and at the adjacent portions of junction 33 may be expected to be about the same, since the emitter and base current paths are approximately the same. Injection at the portions of junction 33 extending beyond the sides of discrete area 24, corresponding to arrows 35', will at least partially balance the injection at the ends of the discrete area. Thus, injection at the junctions 33 between emitter and base rows may be expected to be approximately equal to the injection at the junctions 24 around the discrete base areas. Yet substantially less emitter area is required. Thus the probability of punch-through at the thin base layers beneath the emitter areas due to slight irregularities in diffusion is reduced, thereby improving the processing yield. Also the emitter capacitance is reduced, thereby reducing the emitter charging time constant and promoting high frequency performance. This is especially true at low signal levels where the emitter charging time is a predominant factor in determining $f_t$. With a lower emitter capacitance, higher $f_t$'s may be obtained at low signal levels, thereby improving linearity of operation.

The reduced emitter area is also believed to improve efficiency by reducing the base-collector resistance. Under the emitter areas the base layer is very thin and has a relatively high sheet resistance. The remainder of the base area has a relatively low sheet resistance. The sheet resistances may differ by an order of magnitude or more. Due to the reduction in emitter area, a greater proportion of the base area is of low sheet resistance, thereby yielding a considerably lower base resistance in series with the capacitance of the base-collector junction. When transformed to the equivalent parallel circuit configuration, this yields a higher resistance in parallel with the base-collector capacitance and the load in the output circuit for Q's greater than unity, as is commonly the case in practice. The higher equivalent parallel resistance in the output circuit shunts less power, thereby increasing the collector efficiency in large signal class C operation.

This increase in efficiency is further promoted by using base rows as the outer rows (upper and lower rows in FIG. 1), and by leaving opposite ends of the emitter rows open toward the base layer, as described above.

With the configuration shown in FIG. 1, large emitter-base junction peripheries for a given overall area may be obtained. For example, assume that the smaller dimension of the emitter and base contact areas 25, 26, 27 are the narrowest openings that can reliably be made in an oxide layer taking into account problems of registration. This can be taken as a unit dimension. Then, the height of each discrete base area 23 may be made 3 units, thereby providing a 1 unit spacing from the base contact area 26; the height of the emitter row may be 5 units to provide a 1 unit spacing between junctions 33 and the discrete base areas; the spacing between an emitter contact area 25 and adjacent sides of the discrete base areas may be made 1 unit; and the spacing between the sides of a base contact area 26 and the sides of the discrete base area may be made 1 unit. Similarly, the height of a base contact area 27 may be made 1 unit and its spacing from junctions 33 above and below it made 1 unit, yielding a total height of 3 units for a base row 22.

These relationships allow the total lengths of the base-emitter junction peripheries to be made large while staying within practical limits of masking techniques. Also, the emitter and base current paths can be kept sufficiently short so that voltage drops due to current flow are well below permissible limits, thereby insuring uniform injection. These factors, together with the decreased emitter area and base-collector resistance promotes the obtaining of high power at microwave frequencies.

Figure 7:
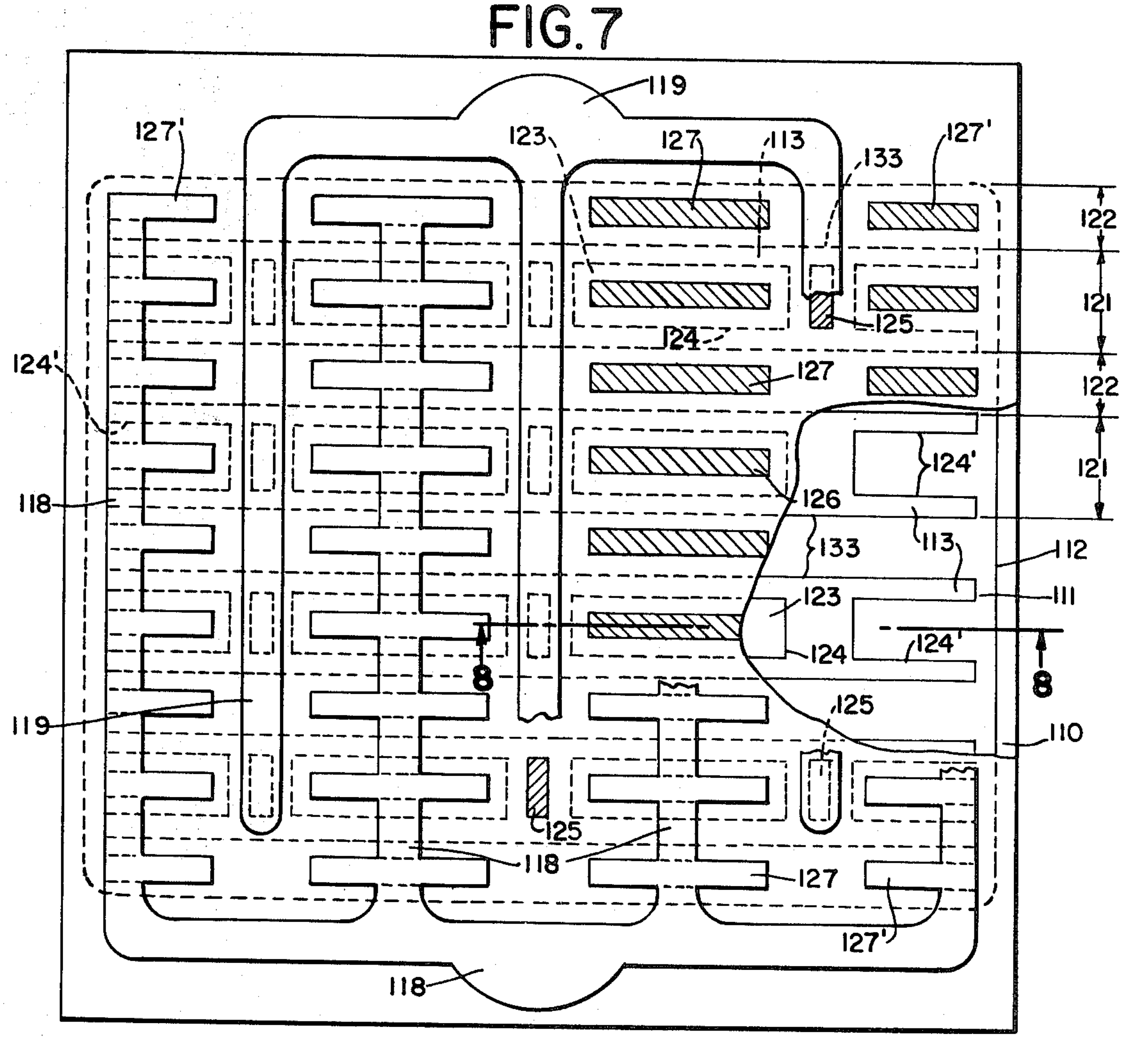
FIGS. 7 and 8 are plan and perspective views, with portions broken away, of a modified embodiment of the invention.
Figure 8:
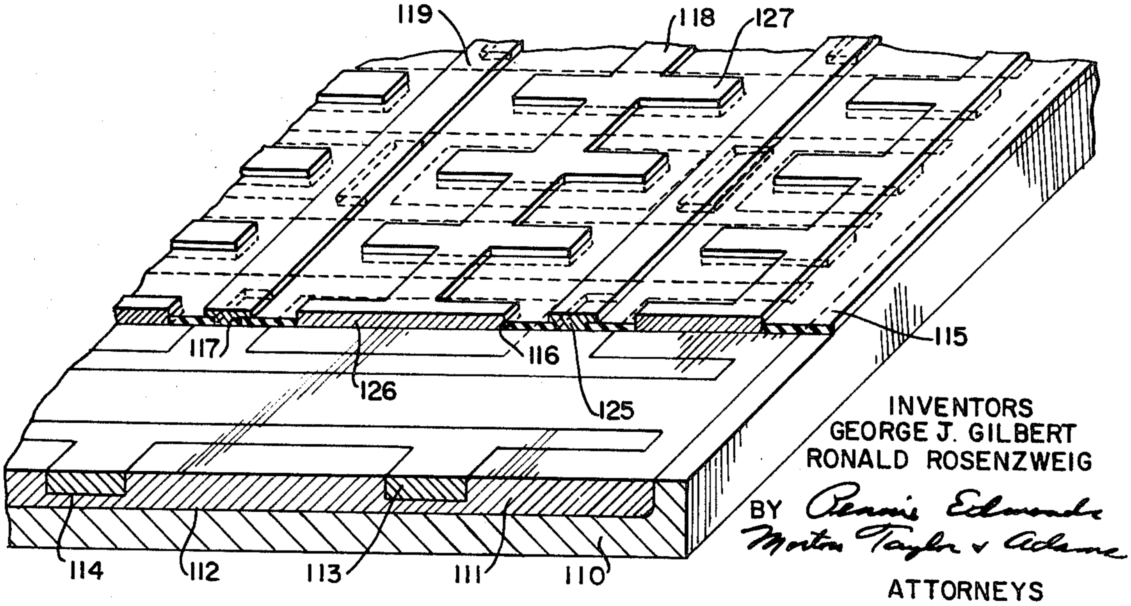

Referring to FIGS. 7 and 8, a configuration is shown in which the emitter area is further reduced over that of FIG. 1. Similar areas are designated by the same numbers plus 100, so that it is unnecessary to repeat the previous description and only differences need be described.

Here the discrete base areas 123 are considerably longer than in FIG. 1, and the base contact areas 126 are made longer so that the distance from the contact area to the base-emitter junction is the same. The base contact areas 127 to the base rows 122 are similarly made longer. Thus the path lengths for base current flow to the junctions are approximately the same as in FIG. 1, and the voltage drops are approximately the same. The path lengths for emitter current flow to the central portions of the upper and lower sides of the junctions 124 and corresponding regions of junctions 133 will be greater. However, the resistivity of the emitter material is commonly much lower than that of the base material, so that the voltage drops may be kept adequately small.

The transistors of the invention permit the use of conventional masking techniques in production. Thus the base layer 11 may initially be diffused into the collector layer 10 and an insulating layer 15, such as a silicon oxide layer, formed thereover. The oxide layer may then be opened for diffusion of the emitter areas into the base layer and the openings reoxidized. The oxide layer may then be reopened at the emitter and base contact areas and metallization applied.

We claim:

1. A high frequency power transistor which comprises
a. a collector layer of one type of semiconductor material,
b. a base layer of opposite type of semiconductor material overlaying said collector layer and defining therewith a base-collector junction,
c. a plurality of space emitter rows each having a plurality of discrete base areas spaced therealong,
d. said emitter rows alternating with rows of said base material,
e. said emitter rows being of said one type of semiconductor material and extending into said base layer to form base-emitter junctions around the peripheries of said discrete base areas and between each emitter row and the base rows on either side thereof,
f. an insulating layer overlaying said emitter and base rows,
g. conductive emitter contact areas extending through said insulating layer to said emitter rows between adjacent discrete base areas,
h. conductive emitter contact means connecting said emitter contact areas,
i. conductive base contact areas extending through said insulating layer to said discrete base areas within respective base-emitter junction peripheries thereof,
j. a plurality of conductive base contact areas extending through said insulating layer to each row of base material and spaced therealong,
k. and conductive base contact means connecting said conductive base contact areas.

2. A transistor in accordance with claim 1 in which the width of the rows of base material between emitter rows is substantially less than the width of the emitter rows.

3. A transistor in accordance with claim 1 in which the outer rows are rows of base material.

4. A transistor in accordance with claim 1 in which opposite ends of each emitter row are open in respect of emitter material to form base-emitter junctions which are open toward the base material adjacent said opposite ends, and conductive base contact areas extending through said insulating layer to the base layer within respective open base-emitter junctions.

5. A transistor in accordance with claim 1 in which the plurality of base contact areas to each row of base material are in alignment with the base contact areas to said discrete base areas to form columns of base contact areas.

6. A transistor in accordance with claim 5 in which opposite ends of each emitter row are open in respect of emitter material to form base-emitter junctions which are open toward the base material adjacent said opposite ends, and conductive base contact areas extending through said insulating layer to the base layer within respective open base-emitter junctions.

7. A high frequency power transistor which comprises
a. a collector layer of one type of semiconductor material,
b. a base layer of opposite type of semiconductor material overlaying said collector layer and defining therewith a base-collector junction,
c. a plurality of spaced parallel emitter rows each having a plurality of approximately rectangular discrete base areas uniformly spaced therealong and in vertical alignment from row to row, d. said emitter rows alternating with rows of said base material,
e. said emitter rows being of said one type of semiconductor material and extending into said base layer to form base-emitter junctions around the peripheries of said discrete base areas and between each emitter row and the base rows on either side thereof,
f. an insulating layer overlaying said emitter and base rows,
g. conductive emitter contact areas extending through said insulating layer to said emitter rows between adjacent discrete base areas,
h. conductive emitter contact means connecting said emitter contact areas,
i. conductive base contact areas extending through said insulating layer to said discrete base areas within respective base-emitter junction peripheries thereof and to areas of intervening base rows in vertical alignment with the discrete base areas,
j. and conductive base contact means connecting said base contact areas.

8. A transistor in accordance with claim 7 in which the vertical spacing of the base contact areas of the base rows from the adjacent base-emitter junctions is approximately equal to the vertical spacing of the base contact areas of the discrete base areas from the adjacent base-emitter junctions.

9. A transistor in accordance with claim 8 in which the base contact areas of said discrete base areas are approximately rectangular with the sides thereof approximately equally spaced from corresponding sides of the discrete base areas, and the base contact areas of said base rows extend along the rows a distance at least as great as approximately the length in that direction of the base contact areas of the discrete base areas.

10. A transistor in accordance with claim 9 in which said emitter contact areas are approximately rectangular with the sides thereof approximately equally spaced from the adjacent sides of the discrete base areas and the adjacent base rows.

11. A transistor in accordance with claim 10 in which the outer rows are rows of base material.

12. A transistor in accordance with claim 11 in which opposite ends of each emitter row are open in respect of emitter material to form base-emitter junctions which are open toward the base material adjacent said opposite ends, and conductive base contact areas extending through said insulating layer to the base layer within respective open base-emitter junctions.

13. A transistor in accordance with claim 12 in which said conductive emitter contact means has a plurality of fingers extending over said insulating layer in alignment with respective vertical columns of said emitter contact areas, and said conductive base contact means has a plurality of fingers extending over said insulating area between the fingers of the conductive emitter contact means in alignment with respective vertical columns of said base contact areas.